United States Patent
Rehani et al.

(10) Patent No.: US 6,807,655 B1
(45) Date of Patent: Oct. 19, 2004

(54) ADAPTIVE OFF TESTER SCREENING METHOD BASED ON INTRINSIC DIE PARAMETRIC MEASUREMENTS

(75) Inventors: Manu Rehani, Portland, OR (US); Kevin Cota, Portland, OR (US); David Abercrombie, Portland, OR (US); Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 62 days.

(21) Appl. No.: 10/197,956

(22) Filed: Jul. 16, 2002

Related U.S. Application Data

(60) Provisional application No. 60/381,746, filed on May 17, 2002.

(51) Int. Cl.[7] ............................. G06F 17/50; G06F 9/45
(52) U.S. Cl. ............................................ 716/4; 716/5
(58) Field of Search ....................... 716/4–5; 438/14–18

(56) References Cited

U.S. PATENT DOCUMENTS

| | | | |
|---|---|---|---|
| 5,787,190 A | * | 7/1998 | Peng et al. .................. 438/17 |
| 6,167,545 A | | 12/2000 | Statovici et al. |
| 6,496,418 B2 | | 12/2002 | Kawahara et al. |
| 6,524,873 B1 | * | 2/2003 | Satya et al. .................. 438/18 |

* cited by examiner

Primary Examiner—Vuthe Siek
Assistant Examiner—Paul Dinh
(74) Attorney, Agent, or Firm—Beyer Weaver Thomas

(57) ABSTRACT

A method for adaptively providing parametric limits to identify defective die quantizes the die into a plurality of groups according to statistical distributions, such as intrinsic speed in one embodiment. For each quantization level, an intrinsic distribution of the parameter is derived. Adaptive screening limits are then set as a function of the intrinsic distribution. Dies are then screened according to their parametric values with respect to the adaptive limits.

18 Claims, 12 Drawing Sheets

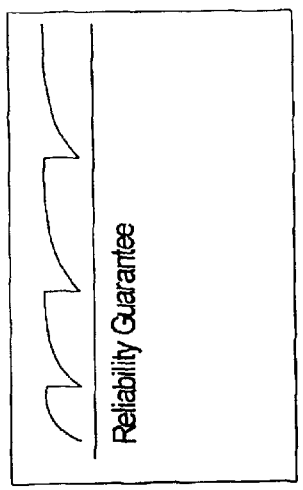
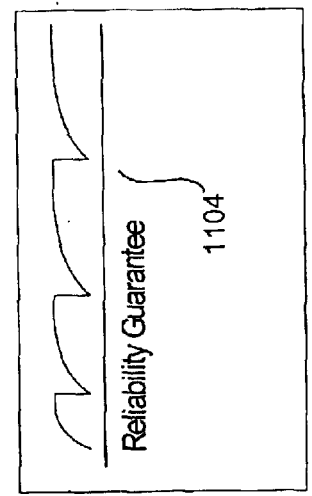
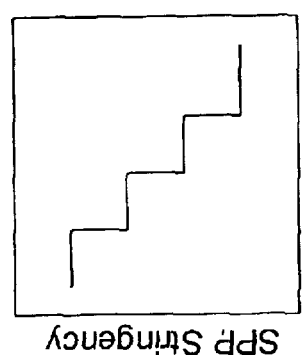
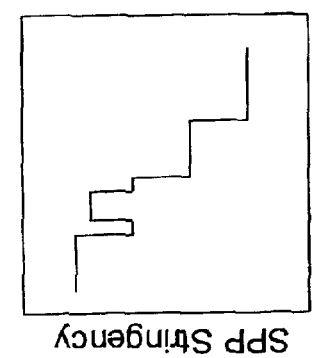
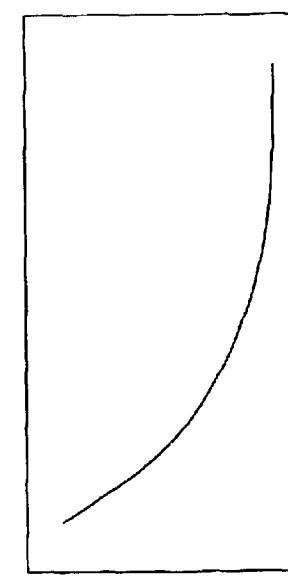
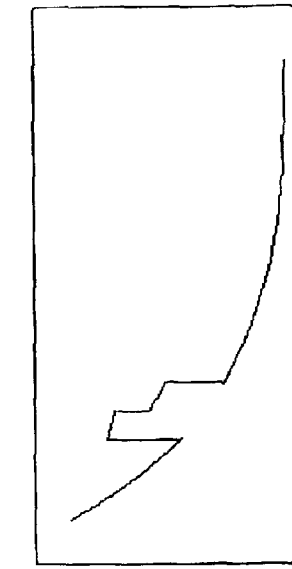
FIG. 10A  FIG. 10B  FIG. 10C
FIG. 11A  FIG. 11B  FIG. 11C

ADAPTIVE OFF TESTER SCREENING METHOD BASED ON INTRINSIC DIE PARAMETRIC MEASUREMENTS This application claims the benefit of provisional application No. 60/381,746, filed on May 17, 2002.

BACKGROUND OF THE INVENTION

1. Field of the Invention

The present invention relates to techniques for screening of integrated circuit dies during semiconductor manufacturing. More particularly, the present invention relates to statistical methodologies used in screening manufactured integrated circuit dies.

2. Description of the Related Art

Semiconductor wafer fabrication involves a series of processes used to create semiconductor devices and integrated circuits (IC's) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

Typically, a large number of dies are formed on a wafer using these methods.

Many of these dies may have defects occurring during the fabrication process, for example during the patterning of layers, which affect the reliability of the die. Some defects, for example, directly affect the functionality of the circuit resulting in functional failure. Other defects may adversely affect the reliability of the circuit resulting in an early lifetime failure or failure under varying operating conditions.

Normal process variations may produce natural variations in device electrical characteristics. For example, current measured in a CMOS transistor may vary in accordance with the channel length. The target channel length is specified by design to meet performance characteristics like current consumption and device speed. However, as illustrated in FIG. 1A, process variations resulting in a larger channel length (L-effective) will result in a device having low speed and low current, though for all other purposes the device is normal. Conversely, process variations may result in an effective channel length smaller than the target length, thus resulting in a high speed, high current device.

Normal process variations will produce an intrinsic probability distribution for a measured parameter. A data point is an "outlier" if it comes from a different probability distribution or from a different deterministic model than the remainder of the data. It is important to effectively screen the dies to identify and separate outliers from the intrinsic distribution.

One conventional test measures the quiescent current (IDDQ) to differentiate between good and defective die. The IDDQ testing relies on detecting the defective chip by monitoring the quiescent current. Identification of defects is based on the fact that a CMOS circuit does not draw any significant current when in a stable situation. Thus, in a quiescent state, only the leakage current flows, which is often negligible. A defect such as a short between transistors may cause the quiescent current to increase, indicating a manufacturing defect. Such defects may cause either functional failures or early lifetime failures.

IDDQ testing is a sensitive technique, able to detect such problems in an early stage and offers an alternative to expensive or time-consuming approaches such as burn-in testing. But the downsizing of semiconductor devices to the sub-micron level has made it increasingly difficult to identify and separate outliers from the intrinsic die distribution using conventional quiescent current testing and evaluation. As the devices have become smaller, the gap between leakage current under normal conditions and quiescent current caused by manufacturing defects has narrowed. As a result, tradeoffs are often made between yield and reliability levels. That is, the difficulty in differentiating between normal and defective dies has required a sacrifice in the yield to achieve certain reliability levels or conversely lower reliability guarantees to achieve certain yield levels.

Accordingly, it is desirable to provide a more effective electrical screening and evaluation method for die without compromising yield factors.

SUMMARY OF THE INVENTION

The present invention provides an off tester adaptive screening method for determining defective die and controlling reliability vs. yield trade-offs. The present invention utilizes the data for a die lot to adaptively set parametric limits for segregating good die from defective die. The off tester data processing method for die screening and disposition uses limits that are adaptive to the distribution at hand, within certain bounds, and can be adjusted form a single point of intervention depending on the quality requirements.

In one aspect, a method of determining the disposition of a semiconductor die includes measuring at least a first and a second parameter for each of a plurality of dies. The plurality of dies are quantized into a plurality of brackets according to the values of the first measured parameter. For each of the plurality of brackets, a statistical relationship is determined for the values of the second parameter for each of the dies in the bracket. The statistical relationship is used to determine an intrinsic distribution function for all of the dies. An adaptive screening limit is set corresponding to the intrinsic distribution function. Dies falling outside the adaptive screening limit are identified as defective or unreliable. In another aspect, the first and second parameters are selected from the group consisting of quiescent current and speed for the dies. In yet another aspect, the group consists of channel length, current, and speed for the dies. In yet another aspect, the group consists of oxide thickness, current, and speed for the dies.

These and other features and advantages of the present invention are described below with reference to the drawings.

BRIEF DESCRIPTION OF THE DRAWINGS

FIGS. 10A–10C are graphical plots illustrating the impacts of new processes or equipment on reliability guarantees in accordance with an embodiment of the present invention.

FIGS. 11A–11C are graphical plots illustrating the impacts of process fluctuations on reliability guarantees in accordance with another embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In conventional testing methods, quiescent current measurements are used to discriminate between faulty dies and good dies. However, quiescent current is linked to the speed of the die which in turn is affected by process variations.

The present invention provides an adaptive screening method for determining defective die and establishing reliability levels for dies. The present invention in one embodiment utilizes the data from a sample of dies, for example a production lot or wafer, and adaptively sets quiescent current limits for segregating normal die from defective die. The dies are initially quantized according to their speeds. For each discrete group of dies, a probability distribution of quiescent currents (intrinsic distribution) is established. Adaptive threshold limits are determined as a function of the intrinsic distribution.

In various embodiments, the present invention applies adaptive off tester screening methods based on parametric measurements to differentiate between good die and outlier die. The off tester data processing method for die screening and disposition uses limits that are adaptive to the distribution at hand, within certain bounds, and can be adjusted form a single point of intervention depending on the quality requirements.

Off tester screening refers to testing outside of the die test program, i.e., after a die has been tested. The process may occur physically on the tester machine or off on a central server. To facilitate discussion, various aspects of the disclosure herein have been made in the context of the current and speed parametric measurements. However, the invention is significantly broader and is applicable to any parametric measurements in general, whether single or in multiples. Further illustrative examples (and again not intending to be limiting) of parametric measurements include channel length vs. current or speed, static measurements vs. quiescent measurements, and oxide thickness vs. current or speed.

Figure 1:
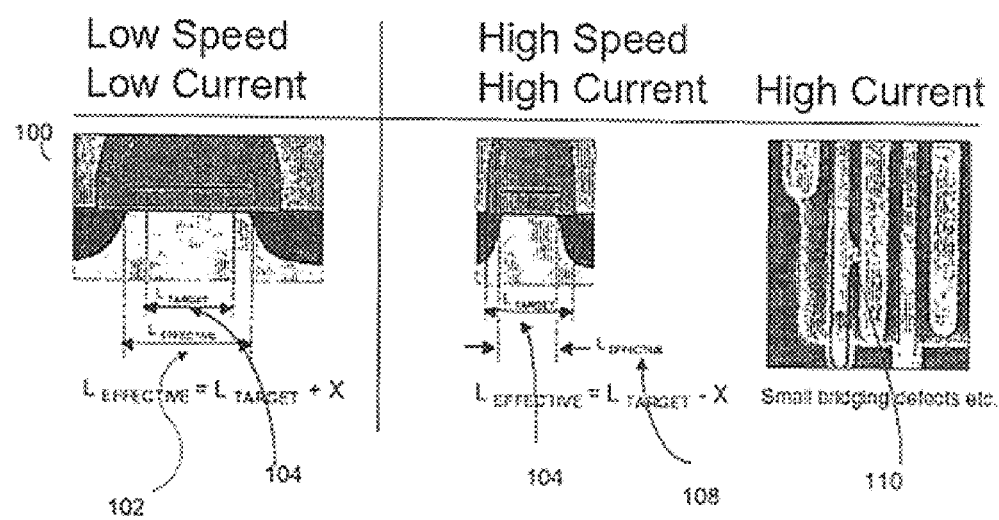
FIGS. 1A–1C are diagrams depicting fabrication details which may affect quiescent currents in conventional processing.

FIGS. 1A–14C are diagrams depicting fabrication details which may affect quiescent currents. The target length (L target) of MOSFET devices directly affects the speed of the device. As illustrated in FIG. 1A, the effective length 102 (L effective) of the channel of the MOSFET device 100 may vary in accordance with process variations in the wafer. Since speeds of semiconductor devices such as MOSFET transistors are linked to the channel length, differences in effective length affects both the speed behavior of the device and the quiescent current. For example, an effective length 102 of the channel, larger than the target length 104, will result in a lower speed for the device with a lower observed quiescent current. In contrast, as illustrated in FIG. 1B, an effective length 108 which is smaller than the target length 104 will result in a speeded up version of the device. This results in the high-speed high current device. But high currents may also be produced by small bridging defects caused by particles 110 as illustrated in FIG. 1C. These defects are of primary concern to semiconductor wafer manufacturers, and if dies containing these defects are passed onto customers, they may result in premature failures (early lifetime failures).

Quiescent current test measurements have conventionally been made in wafer sort and used to identify defects. Current limits are established both theoretically and from empirical data determined from an initial evaluation of one or more die lots. Conventional quiescent current testing eliminates die having high currents in excess of theoretical limits or in excess of empirical limits established from the initial evaluation of wafer die quiescent current data. Quiescent current limits are used in conventional methods by establishing a single high quiescent current to differentiate between passable and defective dies or alternatively, using a step limit with a first quiescent current threshold for low speed devices and the second quiescent current threshold for high speed devices.

Figure 2:
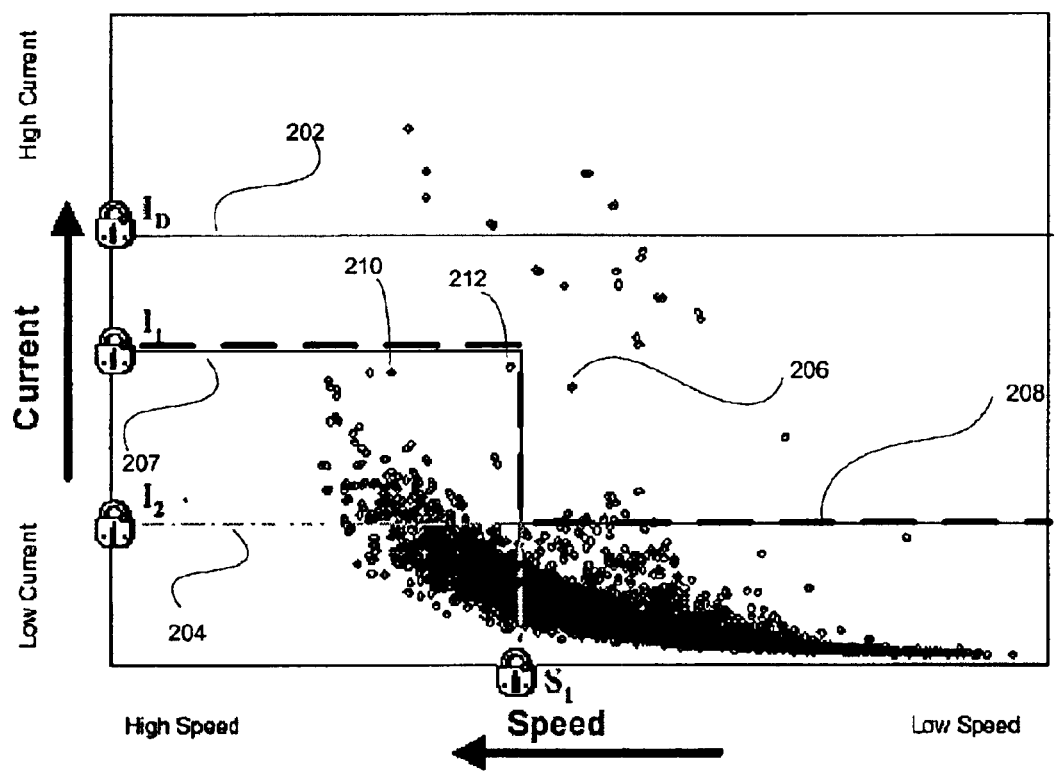
FIG. 2 is a graphical plot illustrating the quiescent current measurements as an example of a parameter for dies having various speeds and a sample speed versus current static limit used in conventional testing systems.

FIG. 2 is a graphical plot illustrating the quiescent current measured for dies having various speeds and sample current versus speed limits used in conventional systems. Initially, a theoretical current limit ($I_D$) 202 is established based on the device size. For example, for MOSFET devices having a specified gate width, for example 0.18 microns, a theoretical limit $I_D$ may be established. Die having measured quiescent currents in excess of these values are determined, with a high degree of confidence, to be defective. As further illustrated in FIG. 2, quiescent current is shown increasing along the vertical axis. Current in excess of $I_D$ 202 indicates a defective die. In conventional methods, a low current limit ($I_2$) 204 is established for low speed die to differentiate between defective die and passing die. Testing evaluations indicating, for example, low speed die having quiescent currents exceeding low current limit line 204 are presumed to represent a statistical outlier and thus a defective die. For example, die 206 is assumed to be defective using the conventional methodology described above. However, to compensate for higher currents expected from devices displaying higher speeds, a stepped pass-fail line is also used. For example, a stepped limit line 208, as illustrated in FIG. 2 permits faster dies, such as dies 210 and 212, to pass inspection whereas slower dies, such as die 206, exhibiting the same quiescent currents will fail inspection. The stepped quiescent current threshold has a second quiescent current limit 207 ($I_1$) for currents in excess of speed $S_1$ and a first (lower) quiescent current threshold 204 ($I_2$) for dies having speeds slower than $S_1$.

Figure 3:
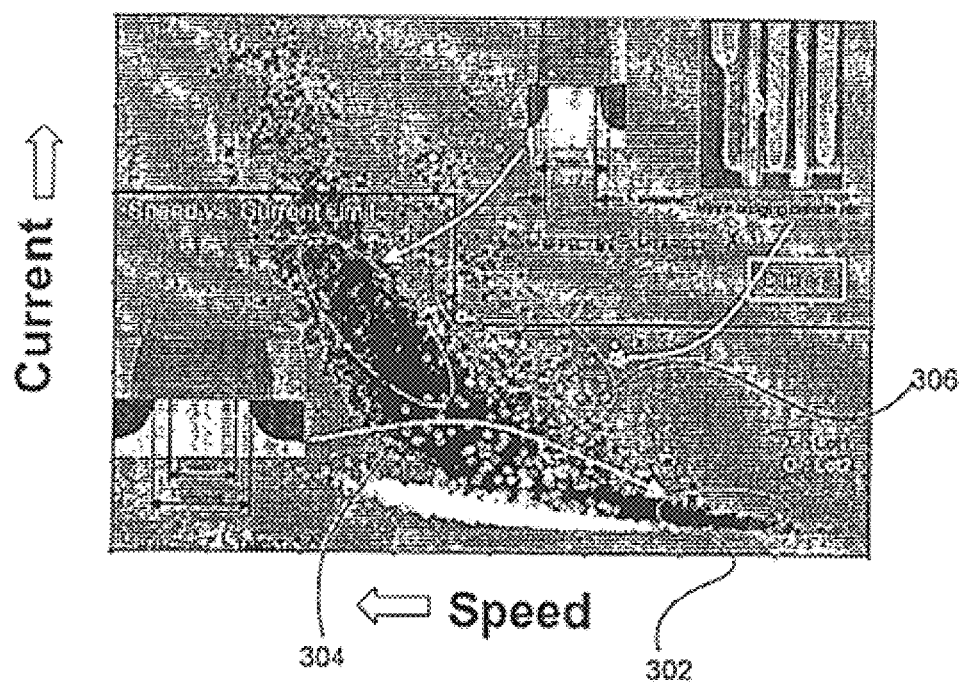
FIG. 3 is a diagram illustrating problems using conventional static current limits to differentiate between good die and defective die.

However, even using a stepped limit line, many outlier dies pass inspection whereas suitable dies fail inspection. FIG. 3 is a diagram illustrating problems using conventional current versus speed limits to differentiate between good die and defective die. The current is plotted along the vertical axis and the speed along the horizontal axis. Test results for two lots, lot 1 (in black) and lot 2 (in white) are depicted. As illustrated in region 302, many of the dies from lot 1 exhibiting low speed and low current pass the conventional quiescent current test. Additionally, dies from lot 2 as shown in region 304 exhibiting high speed and high current also pass the quiescent current testing. However, mixed results occur for statistical outliers shown in region 306, such as caused by minor bridging defects. As illustrated, a number of outlier dies from both lots 1 and 2 are shown to pass inspection, though a portion of the defective dies in this region are shown to fail the inspection test.

Figure 4:
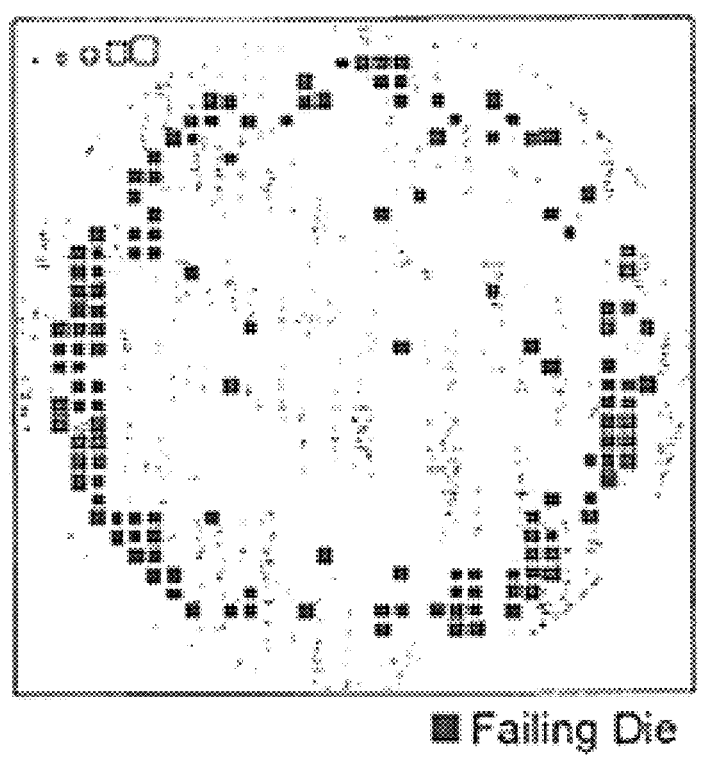
FIG. 4 is a diagram depicting a composite wafer map showing an example of failing die on a wafer.

FIG. 4 is a diagram depicting a composite wafer map showing an example of failing die on a wafer. The size of each square is proportional to the number of failing die at a particular site. The example failing die locations, shown by the darkened squares, result from the application of a static limit in the quiescent current testing. High yield loss is shown occurring on the edge because those devices are often faster and have a higher level of intrinsic leakage. Although the static threshold quiescent current limits show them to be defective, they are not defective. That is, "fast" die such as high current high speed die shown in region 304 in FIG. 3, exceed a single static limit though they may not have any defects. Thus, excessive yield loss results from the relatively poor ability of the static threshold to differentiate between normal "fast"die and defective die.

Figure 5:
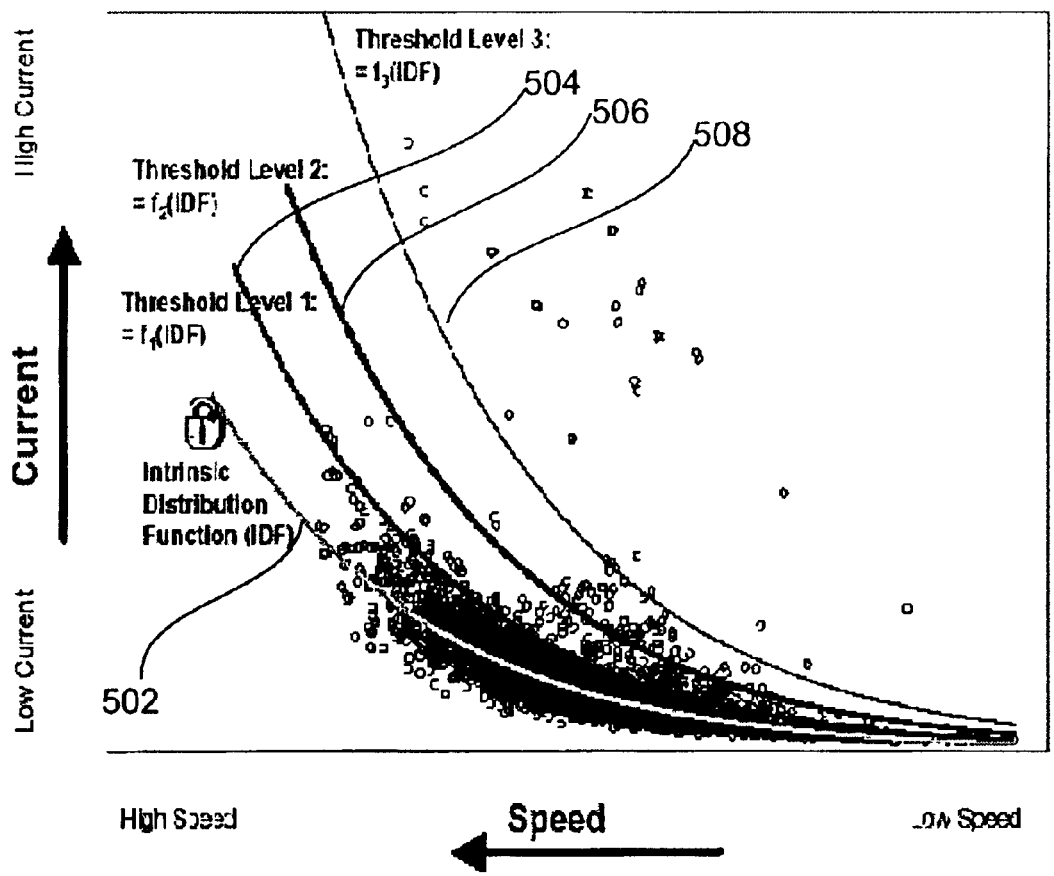
FIG. 5 is a graphical plot illustrating various threshold levels applied to dies in accordance with one embodiment of the present invention.
Figure 6:
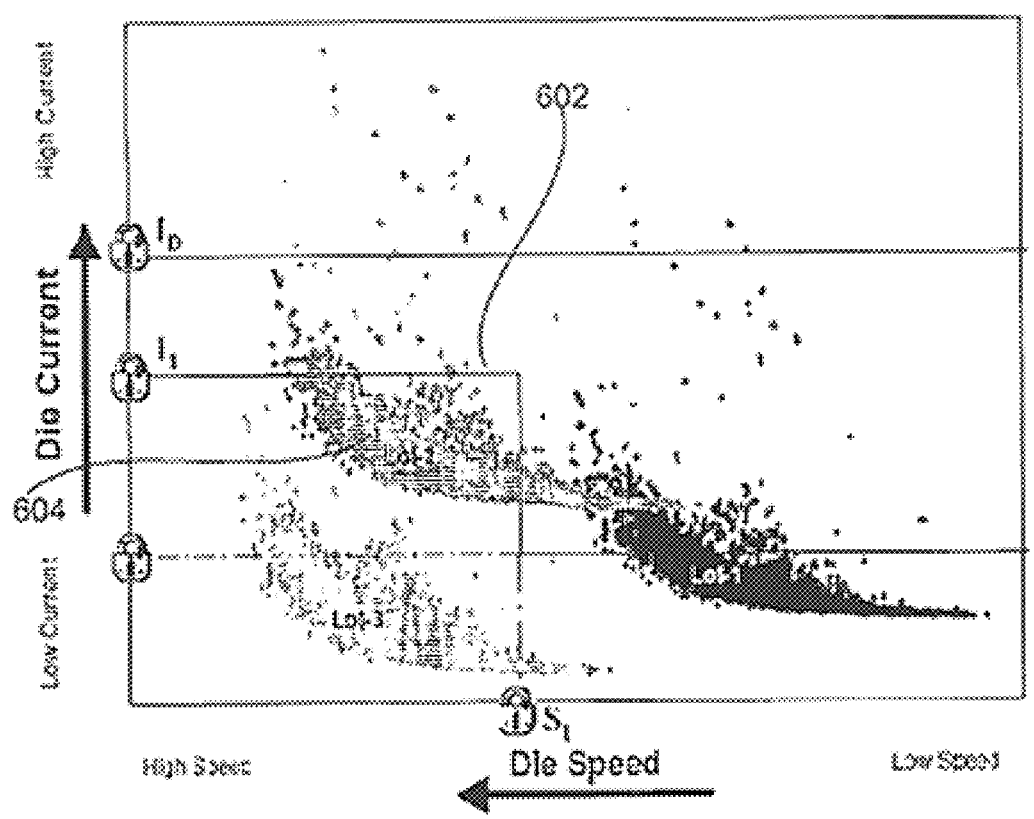
FIG. 6 is a graphical plot illustrating the die current versus die speed for three different lots.

FIG. 5 is a graphical plot illustrating various threshold levels applied to dies in accordance with one embodiment of the present invention. Evaluation of data for a plurality of dies such as a production die lot or wafer will result in an intrinsic distribution function 502 applicable to the die. The present invention, in one embodiment, establishes variable threshold levels as a function of the intrinsic distribution function. As illustrated in FIG. 5, the data determined from IDDQ testing of the production die lot or wafer will result in intrinsic distribution function graphically shown by the example curve 502.

Depending on the customer requirements or the reliability level assurances sought, different threshold levels may be applied to determine the number of passing and failing dies. For example, higher reliability data may be established by applying a threshold level 1 (504) which virtually eliminates all statistical outliers, but at the expense of reducing the yield of the lot or wafer. A second variable threshold, threshold level 2 (506) increases yield but at a cost of decreased lot reliability. Finally a threshold level 3 (508) is applied which has yet higher yield, but again at reduced reliability.

The intrinsic distribution for one lot may not correspond well for other lots. This is depicted, for example, in FIG. 6 which is a graphical plot illustrating the die current versus die speed for three different lots. Initially, a stepped threshold limit 602 is applied based on initial current measurements for a production lot of dies. For example, the application of the stepped threshold 602 to the die within lot 2 (604) will produce a low yield but will eliminate most or all statistical outliers. As a further example, this stepped threshold 602 as applied to the die currents measured for lot 3 will produce a high yield but will allow defective die to pass. The die falling within lot-1 will have a reduced yield because the higher speed die having higher quiescent currents fall within the failed portion of the static stepped threshold 602. Thus it can be seen that threshold limits customized for the characteristics of a particular group, for example a production lot of dies, are expected to provide better identification of defective dies.

Figure 7:
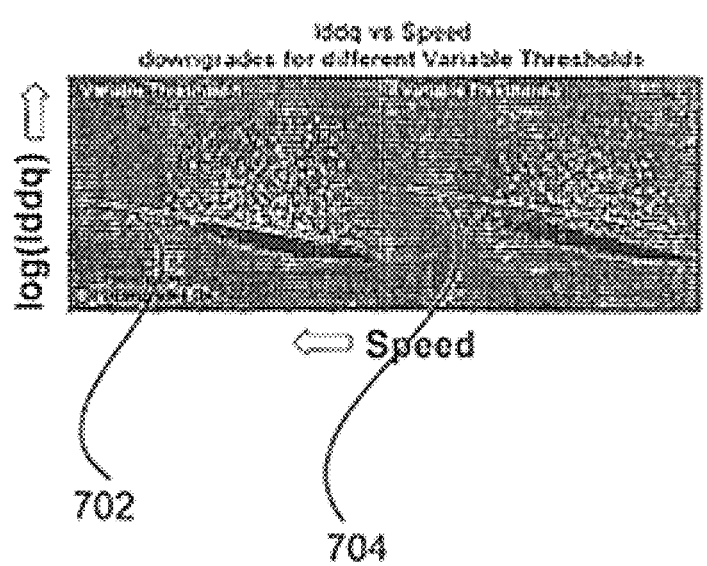
FIG. 7 is a graphical plot depicting the log of the quiescent current as an example of a parameter versus speed with variable thresholds applied in accordance with another embodiment of the present invention.

FIG. 7 is a graphical plot depicting the log of the quiescent current versus speed with variable thresholds applied in accordance with one embodiment of the present invention. Moreover, the scope of the present invention is to include the application of adaptive thresholds to any parametric value or values, and not limited to pairs of values, or to the specific values for current and speed. Methods for measuring quiescent current at wafer level are well known in the relevant art and the present invention in one embodiment is intended to encompass any and all quiescent current measurement methods, whether at a wafer level or a subsequent step in the processing.

Providing a variable or adaptive threshold can be used to adjust the criterion for determining defective die to match reliability assurances or customer requirements. As illustrated, variable threshold-1 (702) permits very little deviation from the intrinsic distribution function of the passing die. In contrast, variable threshold-2 (704) depicts a loosened standard which reduces the number of statistical outliers at a cost of a slightly higher reliability failure rate. Thus, the variable threshold limits, tightened or loosened to achieve the selected reliability level in light of the intrinsic distribution for each die lot will provide more satisfactory results than a single static threshold limit or a stepped limit.

Figure 8:
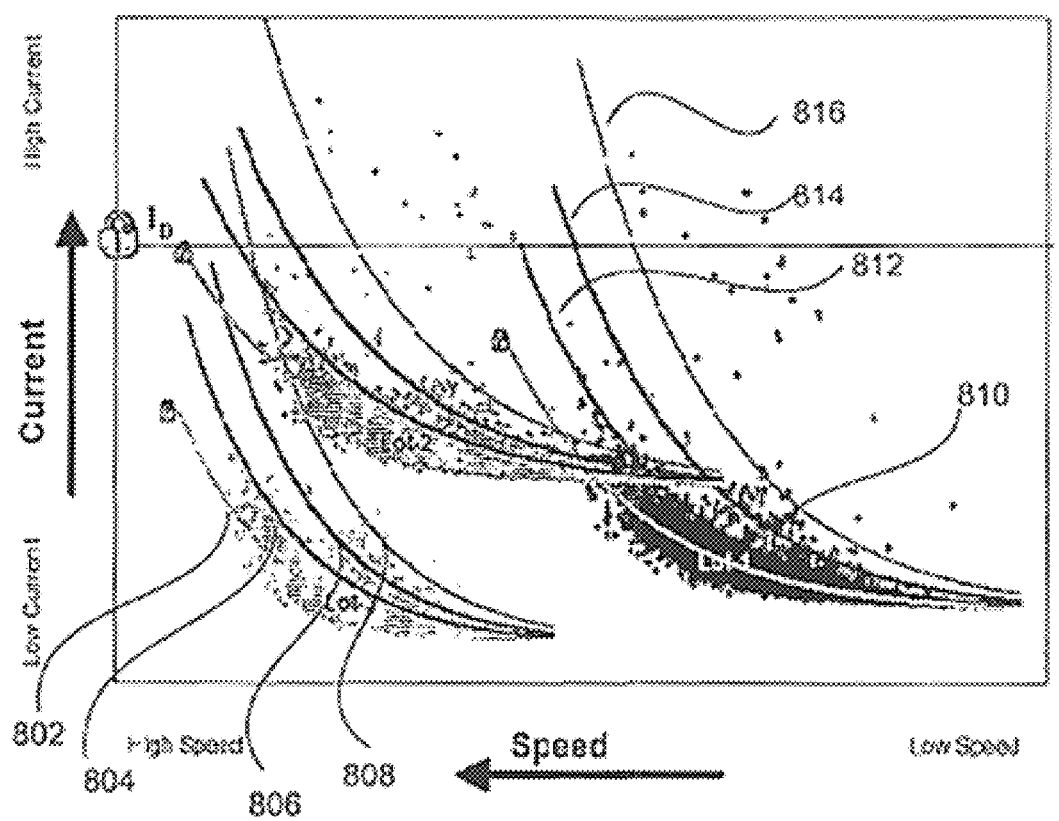
FIG. 8 is a graphical plot illustrating the application of variable thresholds to different lots in accordance with another embodiment of the present invention.

In accordance with another embodiment of the present invention, the thresholds may be adjusted with respect to an intrinsic distribution function which is representative of a particular group or production lot of dies. That is, variations in the production process may result in a new intrinsic distribution function. These variations may include new processes, different equipment, or process fluctuations of the process. FIG. 8 is a graphical plot illustrating the application of variable thresholds to different lots in accordance with one embodiment of the present invention. For example, screening of lot-3 having the intrinsic distribution function 802 may be performed using any of the variable thresholds shown, for example, variable threshold 804, variable threshold 806, or variable threshold 808. Again, rather than using a single threshold limit or a single stepped threshold limit, different variable threshold limits may be applied to lot-1. For example, differentiating between passing and failing dies using variable threshold 812 provides the higher reliability dies than using loosened threshold 814 or threshold 816.

Figure 9A:
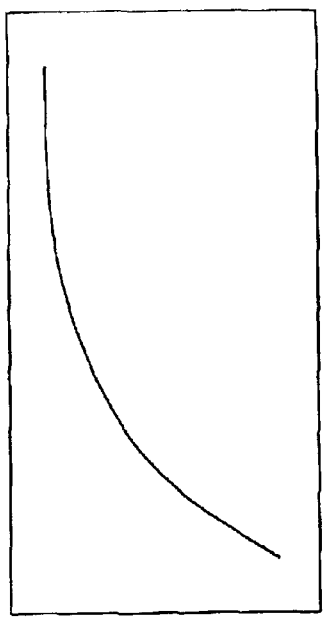
FIGS. 9A–9B is a sequence of plots illustrating the defective events versus time and reliability versus time for fabrication of semiconductor wafers as affected by new processes, equipment, or other variations in accordance with conventional methods.
Figure 9B:
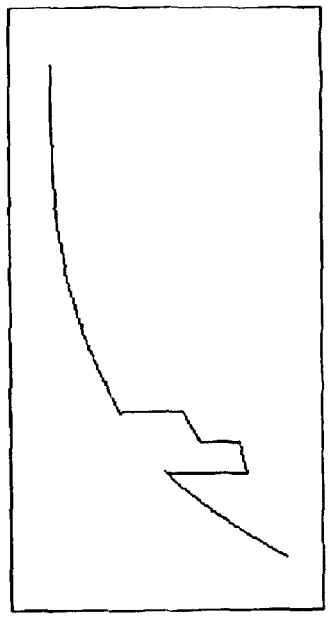

FIGS. 9A–9B is a sequence of plots illustrating the defect events versus time and reliability versus time for fabrication of semiconductor wafers in accordance with new processes, equipment, or other variations. As illustrated, the defect events are high initially but reduce over time for various reasons. For example, problems with initial equipment malfunctions may be corrected. Accordingly, the reliability increases over time. The increase in reliability over time also applies, for example, to new process technologies such as a new gate length, new chemical processing methods, new processing materials, etc. Conventionally, control of reliability has been achieved by taking a large yield hit by tightening the acceptability standards in the sort limits to the worst case, i.e., the data generated from the initial time periods of the sequence.

Figure 9C:
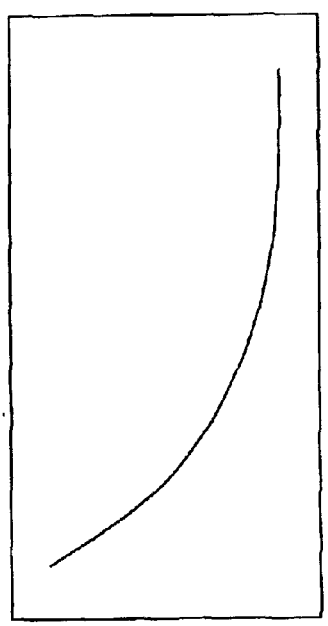
FIGS. 9C–9D is a sequence of graphs illustrating a number of defective events and reliability versus time for process fluctuations according to conventional methods.
Figure 9D:
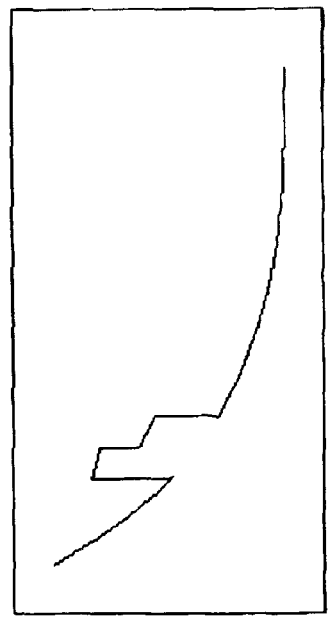

FIGS. 9C–9D is a sequence of graphs illustrating the trend of defect events and reliability versus time for process fluctuations. Process fluctuations may include misprocessing, mishandling, equipment issues, etc. Conventional methods for acceptability standards results in a large yield losses due to scrapping of whole lots because of these unexpected fluctuations.

FIGS. 10A–10C is a series of graphical plots illustrating defect events, statistical post processing (SPP) stringency, and reliability versus time in accordance with one embodiment of the present invention. Statistical post processing of the measured data may be performed on a computing apparatus, such as later described with reference to FIGS. 13A and 13B. An at-risk die, which previously may have been identified as a good die by the tester, is reprocessed when the die is off the tester. In accordance with an embodiment of the present invention, a controlled SPP stringency function is applied over time.

As illustrated in FIG. 10B, the SPP stringency may be a stepped function which is relaxed over time to correspond to the reduced number of defect events occurring over time. The reduction in defective events, as indicated above, may occur as a result of many factors, typically corrective actions taken to adapt to new gate lengths, new chemical processing methods, or new processing materials, for example. The application of the controlled "adaptive" limits for the SPP stringency results in the establishment of a relatively flat reliability guarantee as illustrated in FIG. 10C. That is, using the SPP stringency (i.e., an adaptive limit) permits the screened die to better approximate a selected reliability level. The variable threshold control function, as illustrated in FIG. 10B, may be in other embodiments a preemptive variable threshold control function determined from an analysis of historic defect density trends. For example, a regular defect event trend review may indicate the defect density is trending lower, thus the reliability risk is also less.

FIGS. 11A–11C are graphical plots illustrating the defect events, SPP stringency, and reliability guarantees plotted versus time for process fluctuations. These process fluctuations may comprise, for example, misprocessing, mishandling, equipment issues, etc. The reliability level is guaranteed by a feed forward SPP stringency function. That is, lot sampling may provide in line defect measurements to determine lot defect data or equipment history may provide lot defect data. Identified process fluctuations may be associated with particular die. In accordance with one embodiment, this information may be fed forward to the SPP data processing routines so that specific "at-risk" die may be targeted for tightened screening limits. As illustrated in FIGS. 11A–11C, this data may be fed forward to adjust the variable threshold control function in order to maintain reliability guarantee level 1104 without suffering large yield hits. The embodiments of the present invention minimize yield loss as a result of the ability to target only the at-risk die instead of scrapping entire wafers or lots.

Figure 12:
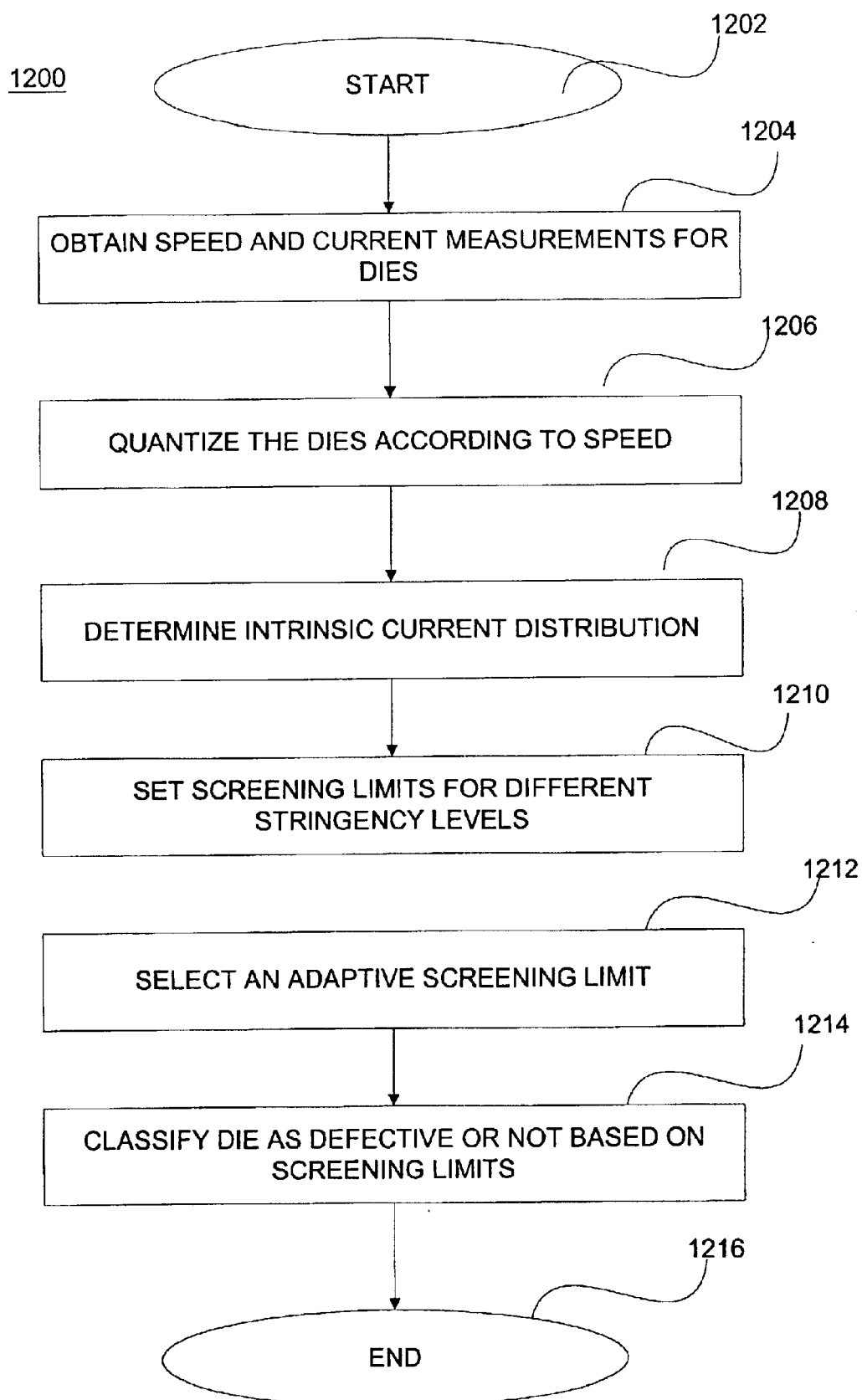
FIG. 12 is a flowchart illustrating a method of setting adaptive screening limits in accordance with one embodiment of the present invention.

FIG. 12 is a flowchart illustrating a method of setting adaptive screening limits in accordance with one embodiment of the present invention. The process 1200 commences at a step 1202 and at a step 1204 wafer sort data is obtained. The measured data in one embodiment includes speed and quiescent current data for all dies in the group. The group may include, for example, the entire wafer or entire lot. At a step 1206, the measured data is quantized according to the die speeds (an example of a first parameter). For example, the dies may be ordered in bins of decreasing speed. Next, at a step 1208, a statistical analysis is computed for the intrinsic current values (i.e., a second parameter) in each speed bin. This statistical data may include central tendency data and data regarding deviations from the central tendency. For example, the statistical data may include a mean or median for the central tendency data and standard deviation data to determine the "spread" of the data. Of course, in alternative embodiments, the techniques as described may be applied to any parametric values selected. In yet other alternative embodiments, the die may be quantized and a distribution determined according to the values for a single parameter.

The intrinsic distribution function for the group of dies may be determined using any suitable analysis techniques which may take the raw measured data and determine a representative function for the data to determine which data belongs or not. Robust statistics using rank ordered percentile methods can be applied, for example. Moreover, the invention is not limited in application to speed and quiescent current measurements. As noted above, embodiments of the present invention have been illustrated using current and speed as examples of parameters. The invention is not so limited but in fact may be applied to any parametric value and is not limited to pairs. For example, single parametric values such as channel length may be used as the basis for the distribution.

The adaptive screening method may be used to further identify at-risk die using any suitable relationship between multiple parameters. For example, channel length vs. current or speed, static measurements vs. quiescent measurements, and oxide thickness vs. current or speed are all expected to provide suitable results in identifying at-risk die. Again, these examples are illustrative and are not intended to be limiting.

From this statistical data, such as $10^{th}$, $25^{th}$, $50^{th}$ (median), $75^{th}$, $90^{th}$, etc. (percentiles), the intrinsic current distribution for the die group is obtained. Following this determination, different levels of screening limits are set as a function of the intrinsic distribution function in a step 1210. A particular reliability level desired may be selected by selecting one of the determined adaptive screening limits in a further step 1212. Next, the screening limit is applied to the die to classify them as either defective or passing in a step 1214. The process ends at a step 1216.

The techniques described in the embodiments of the invention are applicable to the reliability testing of all dies or electronic circuits. They are expected to be particularly useful for deep sub-micron technologies where distinguishing between defective quiescent currents and leakage current is expected to be more difficult with further miniaturization of devices.

Various embodiments of the method of the present invention may be implemented, in whole or in part, on a computing apparatus. Useful machines for performing the operations of this invention include general purpose digital computers or other data processing devices. Such apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

Certain aspects of the methods of the present invention may be embodied in computer software code. Accordingly, the present invention relates to machine readable media that include program instructions, data, etc. for performing various operations described herein. Examples of machine-readable media include, but are not limited to, magnetic media such as hard disks, floppy disks, and magnetic tape; optical media such as CD-ROM disks; magneto-optical media such as floptical disks, and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

Figure 13A:
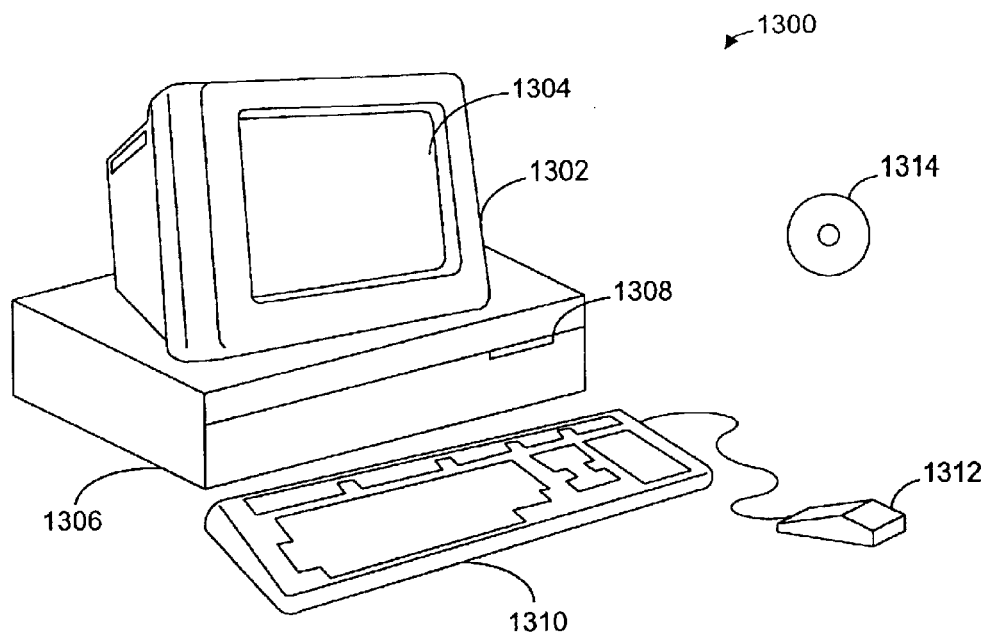
FIGS. 13A and 13B are diagrams illustrating a computer system suitable for implementing embodiments of the present invention.
Figure 13B:
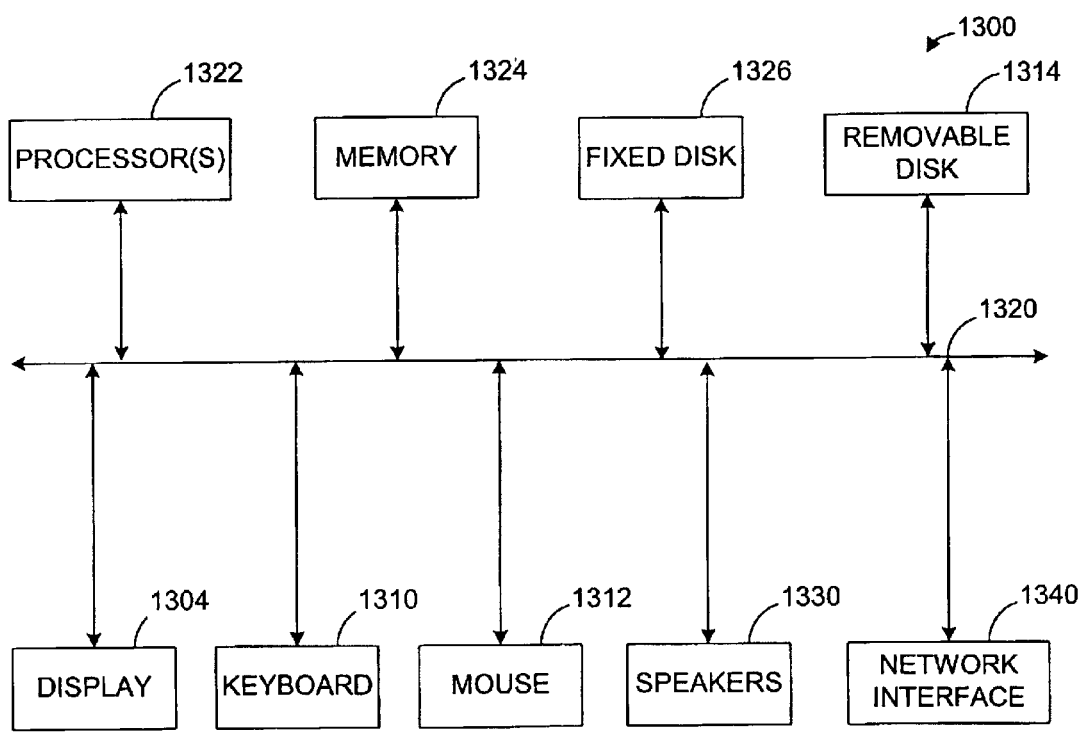

FIGS. 13A and 13B illustrate a computer system 1300 suitable for implementing embodiments of the present invention. FIG. 13A shows one possible physical form of the computer system. Of course, the computer system may have many physical forms ranging from an integrated circuit, a printed circuit board and a small handheld device up to a huge super computer. Computer system 1300 includes a monitor 1302, a display 1304, a housing 1306, a disk drive 1308, a keyboard 1310 and a mouse 1312. Disk 1314 is a computer-readable medium used to transfer data to and from computer system 1300.

FIG. 13B is an example of a block diagram for computer system 1300. Attached to system bus 1320 are a wide variety of subsystems. Processor(s) 1322 (also referred to as central processing units, or CPUs) are coupled to storage devices including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data and the like and is typically a secondary storage medium (such as a hard disk) that is slower than primary storage. It will be appreciated that the information retained within fixed disk 1326, may, in appropriate cases, be incorporated in standard fashion as virtual memory in memory 1324. Removable disk 1314 may take the form of any of the computer-readable media described below.

CPU 1322 is also coupled to a variety of input/output devices such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing. The above-described devices and materials will be familiar to those of skill in the computer hardware and software arts.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of determining the disposition of a semiconductor die and controlling the level of stringency used in determining the disposition, the method comprising:
   measuring at least a first parameter for each of a plurality of dies, wherein the at least a first parameter includes at least one of the groups consisting of channel length, oxide thickness, current, and speed for the dies;
   quantizing the plurality of dies into a plurality of groups according to the values of the first measured parameter, the groups based on an upper limit and a lower limit for the first measured parameter;
   determining a statistical distribution for the dies in each of the plurality of groups;
   determining an intrinsic distribution function for the plurality of dies from the statistical distribution;
   setting an adaptive screening limit corresponding to the intrinsic distribution function; and
   identifying whether the die falls outside the adaptive screening limit.

2. The method of determining the disposition of a semiconductor die as recited in claim 1, wherein a die that falls outside the adaptive screening limit is identified as a defective die.

3. The method of determining the disposition of a semiconductor die as recited in claim 1, wherein said method is using code running on a computing apparatus.

4. The method of determining the disposition of a semiconductor die as recited in claim 1, further comprising measuring a second parameter for each of the plurality of dies; and wherein determining a statistical distribution for each of the plurality of groups comprises determining a statistical relationship for values of the second parameter for each of the plurality of groups.

5. The method of determining the disposition of a semiconductor die as recited in claim 4, wherein the first and second parameters are selected from the group consisting of measured parameters for the dies.

6. The method of determining the disposition of a semiconductor die as recited in claim 4, wherein the first and second parameters are selected from the group consisting of channel length, current, and speed for the dies.

7. The method of determining the disposition of a semiconductor die as recited in claim 4, wherein the first and second parameters are selected from the group consisting of static measurements and quiescent measurements for the dies.

8. The method of determining the disposition of a semiconductor die as recited in claim 4, wherein the first and second parameters are selected from the group consisting of oxide thickness, current, and speed for the dies.

9. The method of determining the disposition of a semiconductor die as recited in claim 4, wherein the setting an adaptive screening limit corresponding to the intrinsic distribution function comprises controlling the level of relaxation from the intrinsic distribution function.

10. The method of determining the disposition of a semiconductor die as recited in claim 9, wherein the level of relaxation is determined in accordance with the reliability expectations of the dies.

11. The method of determining the disposition of a semiconductor die as recited in claim 4, wherein the determining the intrinsic distribution function comprises deriving a statistical function to represent the intrinsic distribution of the first and second parameters.

12. The method of determining the disposition of a semiconductor die as recited in claim 1, wherein setting an adaptive screening limit comprises preemptively relaxing the screening limit in response to process changes which are expected to produce less defective dies over time.

13. The method of determining the disposition of a semiconductor die as recited in claim 12, wherein the process changes include changes in at least one of processing materials, gate lengths, processing chemicals, fabrication equipment, and processing techniques.

14. The method of determining the disposition of a semiconductor die as recited in claim 12, wherein preemptively relaxing the screening limit comprises relaxing the screening limit in at least two steps, the second step having a more relaxed screening limit than the first step.

15. The method of determining the disposition of a semiconductor die as recited in claim 1, wherein setting an adaptive screening limit comprises identifying a group of dies which are affected by a process fluctuation and adjusting the adaptive screening limit for the dies affected by the process fluctuation.

16. The method of determining the disposition of a semiconductor die as recited in claim 15, wherein the group of dies affected by the process fluctuation comprises a portion of a wafer.

17. The method of determining the disposition of a semiconductor die as recited in claim 1, wherein the plurality of dies comprises the dies on a particular wafer.

18. The method of determining the disposition of a semiconductor die as recited in claim 1, wherein the plurality of dies comprises the dies in a particular production lot.

* * * * *